United States Patent [19]

DeLuca et al.

[11] Patent Number: 4,673,865

[45] Date of Patent: Jun. 16, 1987

[54] CHARGE COUPLED LED DRIVER CIRCUIT

[75] Inventors: Michael J. DeLuca, Boca Raton; James G. Mittel, Hypoluxo, both of Fla.

[73] Assignee: Motorola, Inc., Schaumburg, Ill.

[21] Appl. No.: 848,056

[22] Filed: Apr. 4, 1986

[51] Int. Cl.[4] ............................................. G05F 1/46
[52] U.S. Cl. .................................... 323/222; 323/267
[58] Field of Search ............... 323/222, 282, 284, 285, 323/902, 267

[56] References Cited

U.S. PATENT DOCUMENTS 4,413,224 11/1983 Krupka et al. ...................... 323/222

OTHER PUBLICATIONS

Capacitor Drops Voltage with Little Heat for a Low-- Cost Low Voltage Power Supply, Electronic Design 24, Nov. 22, 1975.

Primary Examiner—Peter S. Wong
Assistant Examiner—Judson H. Jones
Attorney, Agent, or Firm—Martin J. McKinley; Daniel K. Nichols; Joseph T. Downey

[57] ABSTRACT

An LED and battery powered driver circuit provide efficient operation to conserve battery energy and maintain the intensity of light emitted from the LED at a substantially constant level despite changes in the battery voltage due to charging and discharging. A pulsed voltage output of a switching power supply is capacitively coupled to the LED. The voltage amplitude of the output pulses is maintained substantially constant by a duty cycle modulator which is connected in a feedback path of the switching power supply. A diode or a transistor circuit is provided to discharge the capacitor between voltage pulses.

4 Claims, 2 Drawing Figures

CHARGE COUPLED LED DRIVER CIRCUIT

BACKGROUND OF THE INVENTION

This invention relates to the field of light emitting diode (LED) circuits and more particularly to battery powered driver circuits for driving LED's.

In the design of selective call personal paging receivers it is desirable to prolong the operating time between battery charges or replacement. As the physical size of paging receivers has been reduced over the years, the size and electrical capacity of their batteries have also been reduced, potentially causing a corresponding reduction in the paging receiver's operating time. To compensate for the reduced battery capacity it is desirable to develop paging receiver circuits that achieve the lowest power consumption possible.

A paging receiver is usually powered from a one cell battery having a normal operating voltage range of 1.1 to 1.7 volts. Ideally, the paging receiver circuits are powered directly from the battery, however, some circuits will not operate at these low voltages and it becomes necessary to add a DC-DC converter to step-up the voltage. The switching power supply 102 of FIG. 1 performs such a DC-DC conversion.

LED's are often used in paging receivers to convey predetermined information to the user. An LED circuit is one example of a circuit that is usually powered from a DC-DC converter rather than directly from a one cell battery. One reason for not operating the LED directly from the battery is that battery voltage can fluctuate considerably which would undesirably cause the intensity of light emitted from the LED to correspondingly fluctuate. In addition the battery voltage may drop below a level that is insufficient illuminate to the LED, but still high enough to operate the receiver circuits. Because DC-DC converters are usually voltage regulated, it is therefore advantageous to power LED circuits from such regulated sources. Unfortunately, LED circuits have the potential to drain a substantial portion of the battery energy.

Referring to FIG. 1, wherein a prior art LED driver circuit is illustrated, an inductor 104 is connected between a node 106 and the positive terminal of a battery 108. The collector of an NPN transistor 110 is connected to node 106 and the emitter is connected to ground. The anode of a diode 112 is also connected to node 106 and the cathode is connected to a node 114. A filter capacitor 116 is connected between node 114 and ground. A duty cycle modulator 118, such as described in U.S. Pat. No. 4,355,277, is connected between node 114 and the base of transistor 110.

In operation, duty cycle modulator 118 periodically switches on and off transistor 110, typically at a frequency of 8500 Hz. When transistor 110 is switched on, current from battery 108 begins to flow through inductor 104, building up the magnetic field in the inductor as the current increases. When transistor 110 is switched off, the magnetic field collapses and a positive voltage pulse appears at node 106. Because inductor 104 is in series with battery 108, the voltage of the pulse at node 106 is greater than the battery voltage.

Thus, the periodic switching of transistor 110 causes a string of pulses to appear at the output terminal of inductor 104 (node 106). These voltage pulses are then rectified and filtered by diode 112 and filter capacitor 116 to produce a multiplied DC voltage (typically 2 or 3 times the battery voltage) at output node 114. To regulate the output voltage, duty cycle modulator 118 samples the output voltage at DC output node 114 and adjusts the duty cycle of transistor 110 so that the DC output voltage remains substantially constant.

Other circuits, represented by load resistor 120, are powered from switching power supply 102 by connecting them to DC output node 114. To power LED 122 from power supply 102, a current limiting resistor 124 is inserted between DC output node 114 and the anode of LED 122. To control the activation of LED 122, the collector of an NPN transistor 126 is typically connected to the cathode of the LED and the emitter is connected to ground. An LED control circuit (not shown) can then activate LED 122 at an appropriate time by sourcing current to the base-emitter circuit of transistor 126, thereby switching on the transistor and permitting current to flow through the LED from power supply 102 and current limiting resistor 124.

Because diode 112 is in series with the LED, approximately 0.6 Volts is lost across the diode. Diode 112 also unnecessarily consumes some battery energy, thereby undesirably reducing battery life. It would be advantageous, therefore, if the LED could be powered from a different point in the power supply, thereby potentially increasing the brightness of the LED and extending the battery life.

Although current limiting resistor 124 serves to regulate the current through LED 122, another disadvantage of the prior art circuit is that additional power is also consumed by resistor 124, thereby further reducing battery life. Therefore, it would be desirable to have a circuit that regulates the current through an LED without unnecessarily reducing the charge on the battery.

SUMMARY OF THE INVENTION

Briefly, the invention is an LED and battery powered driver circuit for use with a battery that has a normal operating voltage range. One embodiment of the invention includes an LED and a power supply for producing a substantially periodic waveform wherein the voltage amplitude of the periodic waveform remains substantially constant over the normal operating voltage range of the battery. A capacitor couples the power supply to the LED. Also included is a discharge means, which is coupled to the capacitor, for discharging the capacitor during a portion of each period of the waveform. The intensity of light emitted from the LED remains substantially constant over the normal operating voltage range of the battery.

In another embodiment the invention includes an LED and a switching power supply having an inductor with an output terminal. Voltage pulses are produced at the output terminal of the inductor and the voltage amplitude of the pulses remains substantially constant over the normal operating voltage range of the battery. A capacitor couples the output terminal of the inductor to the LED. A diode, which is coupled to the capacitor, discharges the capacitor between the voltage pulses. The capacitance of the capacitor is selected to set the average current through the LED and the intensity of light emitted from the LED remains substantially constant over the normal operating voltage range of the battery.

DESCRIPTION OF THE PREFERRED EMBODIMENTS

Figure 1:
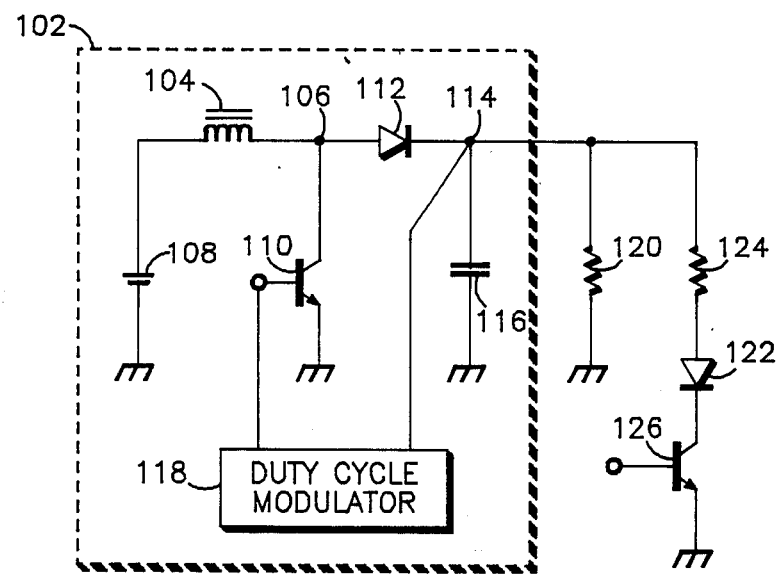
FIG. 1 is a schematic diagram of a prior art LED and driver circuit.
Figure 2:
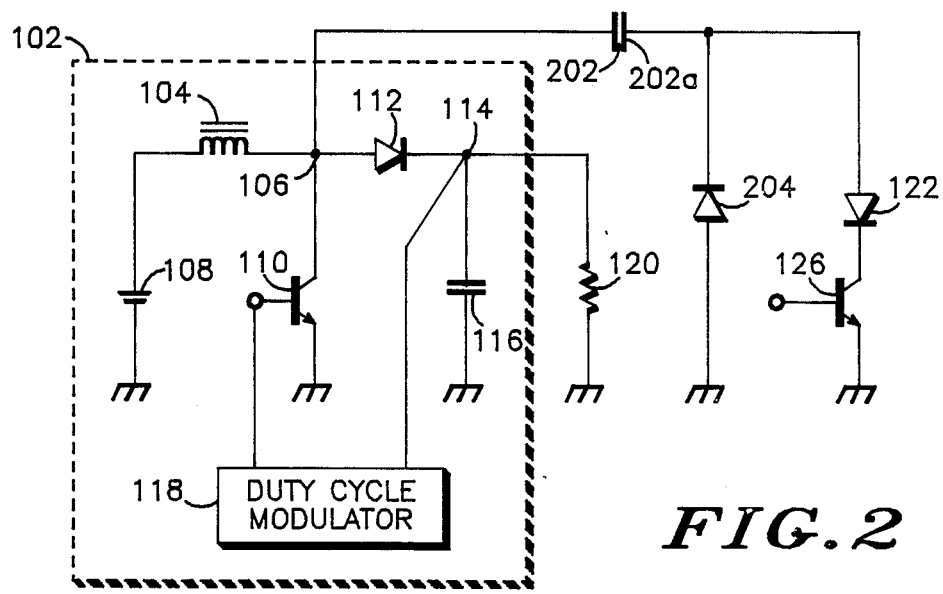
FIG. 2 is a schematic diagram of the preferred embodiment of the present invention.

Illustrated in FIG. 2 is the preferred embodiment of an efficient battery powered LED driver circuit that consumes less battery energy than prior art driver circuits and maintains substantially constant LED brightness over the normal battery operating voltage range. The driver circuit uses switching power supply 102, LED 122 and transistor 126 that were previously described in conjunction with FIG. 1. Also, LED 122 and transistor 126 are mutually interconnected as in FIG. 1 and transistor 126 functions to control the activation of LED 122 as previously described.

In FIG. 2, a capacitor 202, preferably a ceramic capacitor, is connected between the anode of LED 122 and pulse output node 106 of switching power supply 102. The cathode of a diode 204, preferably a silicon diode, is connected to the junction of capacitor 202 and LED 122, and its anode is connected to ground. Once the desired brightness and the corresponding average LED current necessary to produce that brightness are determined, the capacitance of capacitor 122 can then be selected according to well known engineering principles. Although a typical value for capacitor is 0.056 micro-Farads, the particular value selected will depend on such factors as: the internal resistance of switching power supply 102; the peak voltage, duty cycle and frequency of the pulses at output node 106; the voltage drop across LED 122 and the drop across the collector-emitter path of saturated transistor 126; the forward resistance of LED 122; the forward voltage drop across diode 204; and the average LED current required. It should be noted that in prior art FIG. 1, LED 122 is coupled through resistor 124 to a source of DC voltage at DC output node 124, while in the present invention illustrated in FIG. 2, LED 122 is coupled through capacitor 202 to a pulsed voltage source at pulse output node 106.

In operation, during a positive voltage pulse at output node 1 06, current flows through LED 122 via coupling capacitor 202. Because the DC voltage at node 114 is maintained substantially constant by duty cycle modulator 118 and because the forward voltage drop across diode 112 is also substantially constant, the voltage amplitude of the pulses at the output terminal of inductor 104 (node 106) will also remain substantially constant over the normal range of battery voltages (e.g. the normal range of battery voltages may extend below 1.0 Volt near discharge to 1.5 Volts at full charge). This results in the intensity of light being emitted from the LED remaining substantially constant over the normal operating voltage range of the battery.

During positive voltage pulses at node 106, the capacitor plate 202a (which is connected to LED 122) of capacitor 202 begins to charge negatively. Between voltage pulses, i.e. when transistor 110 conducts and momentarily grounds node 106, capacitor plate 202a goes below ground potential. When the negative potential on capacitor plate 202a is sufficient to overcome the small (typically 0.6 Volts) forward voltage drop across diode 204, the diode conducts, substantially discharging capacitor 202. Thus, diode 204 provides a means for discharging capacitor 202 during a portion of each period of the voltage waveform at output node 106.

Those skilled in the art will understand that the voltage potential (referenced to ground) at the anode of LED 122 is the sum of the voltage at output node 106 and the voltage across capacitor 202. Since the voltage across capacitor 202 results from accumulated charge and it is opposite in polarity from the voltage at output node 106, the sum of both voltages will be less than the output voltage at node 106 alone. Thus, any negative charge on capacitor plate 202 tends to reduce the voltage at the anode of LED 122. If no discharging means were provided, capacitor plate 202a would eventually become so negatively charged that the voltage across capacitor 202 would substantially cancel a positive voltage pulse at output node 106 and the voltage at the anode of LED 122 would be insufficient to activate the LED.

Although a diode is the preferred means for discharging capacitor 202, other discharging circuits are also possible. For example, the collector of an additional NPN transistor can be connected to the junction of capacitor 202 and LED 122, and its emitter connected to ground. If the base of this transistor is then appropriately connected to duty cycle modulator 118, the additional or "discharging" transistor will switch on between output voltage pulses, discharging capacitor 202 at the appropriate time.

The use of a transistor as a discharging means has one advantage over the use of diode 204. Since the collector-emitter saturation voltage of a transistor is considerably less than the forward voltage drop across a diode, the use of a transistor as a discharging means permits a more complete discharge of capacitor 202. As previously explained, any negative charge on capacitor plate 202a tends to reduce the voltage at the anode of LED 122. Thus, the use of a discharging transistor can result in slightly higher voltages at the anode of LED 122, which in turn increases LED current and brightness. Therefore, if diode 204 is used as a discharging means and the voltage at output node 106 is insufficient to provide the desirable LED brightness, it may be advantageous to substitute the discharging transistor for diode 204.

Although capacitor 202 is preferably coupled to the pulsed output port (node 106) of a switching power supply, the circuit can also be used with any power supply that produces a substantially periodic waveform of regulated amplitude.

Thus, an LED driver circuit has been described that achieves brighter LED illumination over the prior art circuit by capacitively coupling the LED to a voltage regulated pulsed output port of a switching power supply and discharging the capacitor between pulses. Although some energy is lost when the coupling capacitor is discharged, the driver circuit of the present invention generally provides a more energy efficient method of regulating the current through an LED when compared to the use of the current limiting resistor found in the prior art circuit. This is particularly useful in one cell battery operated equipment where conservation of battery energy and the extension of battery life are extremely important. More importantly, the present invention achieves brighter illumination and conservation of battery energy while substantially maintaining the intensity of light emitted from the LED, despite variations in the battery voltage due to battery charging and discharging.

We claim as our invention:

1. A light emitting diode (LED) and battery powered driver circuit for use with a battery having a normal operating voltage range, said circuit comprising in combination:
- an LED;
- a power supply, suitable for connection to said battery, for producing a substantially periodic waveform, wherein the voltage amplitude of said periodic waveform remains substantially constant over said normal operating voltage range of the battery;
- a capacitor coupled between said power supply and said LED; and
- discharge means, coupled to said capacitor, for discharging said capacitor during a portion of each period of said periodic waveform;
- whereby the intensity of light emitted from said LED remains substantially constant over said normal operating voltage range of the battery.

2. The circuit of claim 1, wherein said discharge means includes a diode.

3. The circuit of claim 1, wherein said discharge means includes a transistor.

4. A light emitting diode (LED) and battery powered driver circuit for use with a battery having a normal operating voltage range, said circuit comprising in combination:
- an LED;
- a switching power supply suitable for connection to said battery and having an inductor with an output terminal, wherein voltage pulses are produced at said output terminal of said inductor and the voltage amplitude of said pulses remains substantially constant over said normal operating voltage range of the battery;
- a capacitor coupled between said output terminal of said inductor and said LED; and
- a diode coupled to said capacitor for discharging said capacitor between said voltage pulses;
- whereby the capacitance of said capacitor is selected to set the average current through said LED and the intensity of light emitted from said LED remains substantially constant over said normal operating voltage range of the battery.

* * * * *